United States Patent [19]

Abe et al.

[11] Patent Number: 5,061,598
[45] Date of Patent: Oct. 29, 1991

[54] PS PLATE FOR USE IN MAKING LITHOGRAPHIC PRINTING PLATE REQUIRING NO DAMPENING WATER

[75] Inventors: Yukio Abe; Yoshihiko Urabe, both of Shizuoka, Japan

[73] Assignee: Fuji Photo Film Co., Ltd., Kanagawa, Japan

[21] Appl. No.: 599,479

[22] Filed: Oct. 18, 1990

[30] Foreign Application Priority Data

Oct. 30, 1989 [JP] Japan .................................. 1-282270
Mar. 29, 1990 [JP] Japan .................................. 2-81896

[51] Int. Cl.$^5$ .............................................. G03C 1/76
[52] U.S. Cl. ............................... 430/272; 430/271 A; 430/300; 430/306
[58] Field of Search .................... 430/271 A, 272, 396, 430/300

[56] References Cited

U.S. PATENT DOCUMENTS

| | | | |
|---|---|---|---|
| 4,732,858 | 3/1989 | Brewer et al. | 430/272 |
| 4,861,698 | 8/1989 | Hiruma et al. | 430/272 |
| 4,874,686 | 10/1989 | Urabe et al. | 430/272 |
| 4,935,332 | 6/1990 | Lauke et al. | 430/306 |

*Primary Examiner*—Jack P. Brammer
*Attorney, Agent, or Firm*—Burns, Doane, Swecker & Mathis

[57] ABSTRACT

A dry PS plate comprises a substrate provided thereon with in order a primer layer, a light-sensitive layer and a silicone rubber layer wherein the primer layer comprises at least one compound selected from the group consisting of those having urethane or/and urea bonds and is adhered to the substrate with a functional group containing silane coupling agent represented by the following general formula:

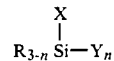

wherein n is an integer ranging from 1 to 3; X represents an alkyl group, a vinyl group or an organic group having a functional group showing affinity to or capable of being bonded to the compound included in the primer layer; R represents a hydrogen atom or an alkyl group having 1 to 5 carbon atoms; and Y represents an organic group which generates a hydroxyl group through hydrolysis or a hydroxyl group. In the dry PS plate, the adhesion strength between the substrate and the light-sensitive layer is substantially improved, the adhesion is surely maintained even after imagewise exposure to light and the subsequent development. The dry PS plate shows excellent image reproduction and the resulting dry lithographic plate is excellent in printing durability as well as resistance to scratch.

19 Claims, No Drawings

PS PLATE FOR USE IN MAKING LITHOGRAPHIC PRINTING PLATE REQUIRING NO DAMPENING WATER

BACKGROUND OF THE INVENTION

The present invention relates to a presensitized plate for use in making a lithographic printing plate requiring no dampening water (hereinafter referred to as "dry PS plate") and in particular to a dry PS plate which is excellent in adhesion between the substrate and the light-sensitive layer in wet state during developing treatment and which can provide a lithographic printing plate requiring no dampening water (hereunder referred to as "dry lithographic plate") improved in the printing durability and resistance to scratch.

There have been proposed a variety of dry PS plate in which a silicone rubber layer serves as non-image portions (see, for instance, Japanese Patent Publication for Opposition Purpose (hereunder referred to as "J. P. KOKOKU") Nos. Sho 44-23042 (U.S. Pat. No. 3,677,178), Sho 46-16044 (U.S. Pat. No. 3,511,178), Sho 54-26923 (U. S. Pat. No. 3,894,873), Sho 61-54222 (U.S. Pat. No. 4,342,820) and Sho 63 26247).

There have been known two types of methods for making printing plates from dry PS plates of this kind, one of which comprises dissolving a light-sensitive layer on the image areas with a developer to remove a silicone rubber layer present thereon to thus give images (J. P. KOKOKU No. Sho 46-16044 (U.S. Pat. No. 3,511,178)) and the other of which uses a dry PS plate comprising a photoadhesive light-sensitive layer or a photopeelable light-sensitive layer and a silicone rubber layer, comprises selectively removing only the silicone rubber layer on the image areas (see J. P. KOKOKU No. Sho 54-26923 and Japanese Patent Unexamined Publication (hereunder referred to as "J. P. KOKAI") No. Sho 56-80046 (U.S. Pat. No. 4,342,820)).

The latter case will be explained below using a dry PS plate comprising a photoadhesive light-sensitive layer and a silicone rubber layer by way of example. The photoadhesive light-sensitive layer and the silicone rubber layer of this PS plate are strongly adhered to one another through exposure to light. Therefore, the development of the PS plate is performed using a developer which does not substantially dissolve the photoadhesive light-sensitive layer and is capable of swelling the light-sensitive layer and/or the silicone rubber layer. Thus, the silicone rubber layer on the image areas is selectively removed and peeled off to expose the light-sensitive layer which serves as an ink receiving part. However, this plate making method suffers from the following problems. For instance, since the adhesion between the light-sensitive layer and the silicone rubber layer is insufficient, a part of the light-sensitive layer on the nonexposed portion is peeled off, as a result the surface of the substrate is exposed. The ink receptivity of the light-sensitive layer is different from that of the exposed substrate. This difference is possibly reflected on the printed matters and thus satisfactory copies cannot be obtained at all.

Under such circumstances, many attempts have been directed to the improvement in the adhesion between the light-sensitive layer and the silicone rubber layer. For instance, J. P. KOKOKU No. Sho 61-54219 discloses a method in which a primer layer containing an epoxy resing positioned between these layers. This primer layer can ensure good adhesion to the substrate, but the adhesion thereof to the light-sensitive layer is greatly affected by components of the latter. More specifically, if the components of the light sensitive layer are changed in order to improve, for instance, the printing durability and resistance to scratch of the resulting lithographic plate as well as the sensitivity and fine image-reproduction Of the PS plate, the adhesion between the primer layer and the light sensitive layer is impaired.

Moreover, the resistance to scratch of the PS plate is greatly dependent upon the flexibility of the light-sensitive layer as well as that of the primer layer. In this respect, there has long been desired for the development of a primer layer having flexibility higher than that of the epoxy resins. As an attempt for improving the flexibility of the primer layer, there has been known a method in which a rubber component is used for forming a primer layer and the rubber component is a polyurethane (see J. P. KOKAI No. Sho 61 163343 which relates to a dry PS plate comprising a photopeelable light sensitive layer). However, this method is still insufficient in the adhesion of the primer layer to the substrate.

SUMMARY OF THE INVENTION

Accordingly, an object of the present invention is to provide a dry PS plate provided with a novel primer layer which is excellent in adhesion between the substrate and the light-sensitive layer and which can provide a dry lithographic plate improved in the printing durability and resistance to scratch.

The foregoing object and other objects of the present invention can be achieved by providing a dry PS plate which comprises a substrate provided thereon with in order a primer layer, a light sensitive layer and a silicone rubber layer, wherein the primer layer comprises at least one compound selected from those carrying urethane and/or urea bonds and is adhered to the substrate with a functional group containing silane coupling agent represented by the following general formula:

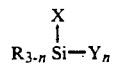

wherein n is an integer ranging from 1 to 3; X represents an alkyl group, a vinyl group or an organic group carrying a functional group capable of being bonded to or having affinity to the compound included in the primer layer; R represents a hydrogen atom or an alkyl group having 1 to 5 carbon atoms; and Y represents an organic group which generates hydroxyl group through hydrolysis or a hydroxyl group.

DETAILED DESCRIPTION OF THE INVENTION

The present invention will hereinafter be explained in more detail.

The dry PS plate of the present invention is provided with a novel primer layer which comprises at least one compound selected from those carrying urethane and/or urea bonds and is adhered to a substrate of the PS plate with a functional group containing silane coupling agent.

The compounds having urethane and/or urea bonds used in the present invention are those comprising a reaction product of a polyisocyanate compound with a polyol compound or/and a polyamine compound as a basic skeleton and more preferably those comprising a reaction product of a polyisocyanate compound represented by the following general formula (I) with a polyol compound represented by the following general formula (II) or/and a polyamine compound represented by the following general formula (III) as a basic skeleton:

$$OCN-L^1-NCO \quad (I)$$

wherein $L^1$ represents a divalent aliphatic or aromatic hydrocarbon connecting group which may have substituents such as alkyl, aralkyl, aryl and/or alkoxy groups and/or halogen atoms;

$$HO-L^2-OH \quad (II)$$

wherein $L^2$ represents a divalent aliphatic or aromatic hydrocarbon connecting group which may have substituents such as alkyl, aralkyl, aryl and/or alkoxy groups and/or halogen atoms and which may contain an intervening ester or ether bond;

$$H_2N-L^3-NH_2 \quad (III)$$

wherein $L^3$ represents a divalent aliphatic or aromatic hydrocarbon connecting group which may have substituents such as alkyl, aralkyl, aryl and/or alkoxy groups and/or halogen atoms.

Specific examples of the diisocyanate compounds represented by Formula (1) are as follows, but the present invention is not restricted to these specific ones:

2,4-Tolylenediisocyanate, 2,6-tolylenediisocyanate, p-xylylenediisocyanate, m-xylylenediisocyanate, 4,4'-diphenylmethanediisocyanate, 1,5-naphthylenediisocyanate, 3,3'-dimethylbiphenyl 4,4'-diisocyanate, hexamethylenediisocyanate, isophoronediisocyanate and 4,4'-methylenebis(cyclohexylisocyanate).

Specific examples of the diol compounds represented by Formula (II) are as follows, but the present invention is not restricted to these specific ones:

Ethylene glycol, diethylene glycol, triethylene glycol, propylene glycol, polyethylene glycol, polypropylene glycol, neopentyl glycol, 1,4-butanediol, 1,3-butanediol, 1,6-hexanediol, hydrogenated bisphenol A, an ethylene oxide adduct of hydrogenated bisphenol A and polyesterdiol such as copolymers of adipic acid and propylene glycol and copolymers of adipic acid, ethylene glycol and 1,4-butanediol.

Specific examples of the diamine compounds represented by Formula (III) are as follows, but the present invention is not restricted to these specific ones:

Ethylenediamine, 1,4-tetramethylenediamine, 1,6-hexamethylenediamine, isophoronediamine, m-xylylenediamine, p-xylylenediamine, 4,4'-diaminodiphenylmethane, 4,4'-diaminodiphenyl ether and 4,4'-methylenebis(2-chloroaniline).

The compounds carrying urethane and/or urea bonds used in the present invention can be prepared by heating the foregoing diisocyanate compound, diol compound and diamine compound in an aprotic solvent. In this preparation, a known catalyst can be added to the reaction system. Preferably, a diisocyanate compound is reacted with a diol compound to form a prepolymer and then the prepolymer is reacted with a diamine compound. Alternatively, the compounds carrying urethane and/or urea bonds may be those carrying terminal isocyanate groups obtained by reacting these compounds at a molar ratio of the isocyanate groups to the sum of the hydroxyl and amino groups of not less than 1. Moreover, the compound carrying terminal isocyanate groups can be subjected to a functional group-exchange reaction by addition of a compound having a functional group capable of reacting with the isocyanate groups. For instance, the terminal isocyanate groups can be converted into amino groups by addition of water or into hydroxyl groups by addition of mono- (or di- )ethanolamine.

Alternatively, the compounds carrying urethane and/or urea bonds may be those carrying terminal hydroxyl groups or amino groups obtained by reacting these compounds at the molar ratio of not more than 1.

The molar ratio of the diol compound to the diamine compound preferably ranges from 0.1:0.9 to 0.9:0.1 and more preferably 0.2:0.8 to 0.8:0.2.

The weight-average molecular weight of the compound carrying urethane and/or urea bonds used in the invention is preferably not less than 5,000 and more preferably 10,000 to 200,000.

The silane coupling agents used in the invention to ensure the adhesion between the substrate and the primer layer are those represented by the following general formula:

$$R_{3-n}\overset{X}{\underset{|}{Si}}-Y_n$$

wherein R represents a hydrogen atom or an alkyl group having 1 to 5 carbon atoms; X represents an alkyl group, a vinyl group or an organic group carrying a functional group capable of being bonded to an organic matrix polymer or having affinity thereto; Y represents an organic group which generates hydroxyl group through hydrolysis or a hydroxyl group; and n is an integer ranging from 1 to 3.

The alkyl group represented by X is preferably a methyl group or if X is an organic group carrying a functional group capable of being bonded to an organic matrix polymer or having affinity thereto, the functional group may be, for instance, a vinyl, methacryloyl, amino, quaternary ammonium, epoxy, isocyanate or mercapto group or a chlorine atom. In addition, the organic group except for the functional group is preferably an aliphatic hydrocarbon group which may include an aromatic hydrocarbon group therein. Preferred specific examples of the organic groups having such a functional group include N-(β-aminoethyl)-γ-aminopropyl group, γ-methacryloxypropyl group, N-[(β-vinylbenzylamino)ethyl]-γ-aminopropyl group, γ-glycidoxypropyl group, γ-mercaptopropyl group, γ-chloropropyl group, γ-anilinopropyl group, γ-isocyanatopropyl group and $C_{18}H_{37}-N^+(CH_3)_2(CH_2)_3-$.

The organic group represented by Y which generates hydroxyl group through hydrolysis is, for instance, an alkoxy group having 1 to 5 carbon atoms (preferably a methoxy group), an alkoxyalkoxy group having 3 to 5 carbon atoms (preferably γ-methoxyethoxy group), an acyloxy group having 2 to 5 carbon atoms (preferably acetyloxy group), a dialkylamino group (preferably dimethylamino group), a chlorine atom or a trimethylsilylamino group.

Typical examples of the silane coupling agents useful in the present invention are as follows:

(1) Unsaturated Group-Containing Silane Coupling Agents: for instance, vinyltrimethoxysilane, vinyltriethoxysilane, vinyltris($\beta$-methoxyethoxy)silane, vinyltrichlorosilane, $\gamma$-(methacryloxypropyl) trimethoxysilane and vinyltriacetoxysilane;

(2) Amino Group-Containing Silane Coupling Agents: for instance, N-($\beta$-aminoethyl)-$\gamma$-aminopropyltrimethoxysilane, N-($\gamma$-aminoethyl)-$\beta$-aminopropylmethyldimethoxysilane, $\beta$-aminopropyltriethoxysilane, N-($\gamma$-aminoethyl)-$\gamma$-aminopropyltriethoxysilane and N-phenyl-$\gamma$-aminopropyltrimethoxysilane;

(3) Epoxy Group Containing Silane Coupling Agents: for instance, $\gamma$-glycidoxypropyltrimethoxysilane, $\gamma$-glycidoxypropylmethyldimethoxysilane and $\gamma$-(3,4-epoxycyclohexyl)ethyltrimethoxysilane;

(4) Mercapto Group Containing Silane Coupling Agents: for instance, $\gamma$-mercaptopropyltrimethoxysilane and $\gamma$-mercaptopropylmethyldimethoxysilane;

(5) Chlorine Atom-Containing Silane Coupling Agents: for instance, $\gamma$-chloropropyltrimethoxysilane, $\gamma$-chloropropylmethyldimethoxysilane, methyltrichlorosilane, dimethyldichlorosilane and trimethylchlorosilane;

(6) Isocyanate Group-Containing Silane Coupling Agents: for instance, $\gamma$-isocyanatopropyltrimethoxysilane, $\gamma$-isocyanatopropylmethyldimethoxysilane, $\gamma$-isocyanatopropyltriethoxysilane and $\gamma$-isocyanatopropylmethyldiethoxysilane.

The foregoing silane coupling agents used in the invention are known and disclosed in, for instance, "Hyomen (Surface)", 1983, 21, pp. 157-167 and E. P. Plueddemann, "Silane Coupling Agents", Plenum Press, 1982.

In the practice of the present invention, the silane coupling agents may be applied onto the surface of a substrate in advance or incorporated into a solution for forming a primer layer and then applied onto the surface.

Moreover, the silane coupling agent used in the invention may further comprise a polyfunctional isocyanate group-containing monomer. This ensures the further improvement of the adhesion of the primer layer to the substrate.

In addition, the light-sensitive layer also preferably comprises at least on compound selected from the compounds having urethane and/or urea bonds. The compounds of this kind to be incorporated into the light-sensitive layer and the primer layer may be the same or different.

The dry PS plate of the present invention will hereunder be explained in more detail.

SUBSTRATE

The dry lithographic plate must have flexibility sufficient for putting it on the usual printing press or the like and can withstand the load which is applied thereto during printing operations. For this reason, typical substrates usable are, for instance, a metal plate such as an aluminum, copper or steel plate, a plastic film such as a polyethylene terephthalate film, coated paper, a rubber plate or a composite plate thereof as well as substrates having rubber elasticity, those provided with a layer having rubber elasticity or cylindrical substrates.

Preferred substrates are aluminum plates. The aluminum plates used in the present invention are plate like materials of pure aluminum or an aluminum alloy comprising aluminum and a trace amount of other elements such as silicon, iron, manganese, copper, magnesium, chromium, zinc, bismuth, nickel and/or titanium. The amount of the elements other than aluminum is in the order of not more than 10% by weight. The aluminum substrate preferably used in the invention is a Pure aluminum plate, but it is presently difficult to obtain a completely pure aluminum plate from the viewpoint of refining technique. Therefore, an aluminum plate having a content of other element as low as possible is employed. The aluminum plate having a content of other element in the order of the foregoing range can be used in the invention without any problem. In other words, the aluminum plates usable in the invention are not restricted to those having specific compositions and may be those commonly known and used in this art. The aluminum plate used in the invention has a thickness in the order of about 0.1 to 0.5 mm.

Such an aluminum plate is optionally treated with an aqueous solution containing a surfactant or an aqueous alkaline solution to remove the rolling oil from the surface thereof.

The aluminum plate thus degreased may optionally be subjected to an anodization treatment. The conditions for the anodization treatment greatly vary depending on the kinds of electrolytes used, but in general the conditions for the anodization are the concentration of electrolyte ranging from 1 to 80% by weight, the temperature of the electrolyte ranging from 5° to 70 °C., the current density ranging from 0.5 to 60 A/dm$^2$, the electric voltage ranging from 1 to 100 V and the electrolyzing time ranging from 10 seconds to 50 minutes. The amount of the anodized layer preferably ranges from 0.01 to 10 g/m$^2$ and more preferably 0.1 to 4 g/m$^2$.

The aluminum plate which has been subjected to the foregoing treatments is then preferably washed with water, treated with an aqueous solution of an alkali metal silicate or coated with a colloidal silica sol. It is also possible to subject the aluminum plate to such an alkali metal silicate treatment followed by the application of a colloidal silica sol or further the plate may be subjected to a surface treatment with a solution containing the foregoing silane coupling agent.

In the alkali metal silicate treatment, an aqueous solution of sodium silicate, potassium silicate or lithium silicate is employed as disclosed in U.S. Pat. Nos. 2,714,066 and 3,181,461. The alkali metal silicate treatment is desirably performed, for instance, by immersing in or spraying an aqueous solution having a concentration ranging from 0.5 to 30% by weight, preferably 1 to 15% by weight at a temperature ranging from 15° to 90 °C. for 0.5 to 120 seconds and then washing with water.

The foregoing colloidal silica sol is a colloidal silica sol solution obtained by dispersing, in a solvent, ultrafine powder of a high molecular weight anhydrous silicate. Those dispersed in water are called "aqueous silica sol" or those dispersed in an organic solvent "organosilica sol". The silica sol is formed according to a method in which sodium is removed from a soluble glass as a starting material or a method in which a silicate ester is employed as a starting material. The methods and the properties thereof are detailed in, for instance, "Ceramics Coatings", Section 3, Nikkan Kogyo Newspaper Publishing Company, September, 1988 and "Inorganic Coatings", Section 1, Kindai Book Publishing Company, July, 1983. Among these colloidal silica sols, aqueous silica sols and silica sols dispersed in methanol are preferred in the light of the methods for preparing the same. The colloid silica sol in general comprises 10 to 50% by weight of $SiO_2$ and 0.01 to 2.00% by weight of $Na_2O$ and has a particle size ranging from 5 to 30 μm.

These colloidal silica sols may be applied to the aluminum plate by any method such as coating method using a whirler, a roll coater, a bar coater or a dipping treatment.

A coating solution or a treating solution of the colloidal silica sol can be prepared by diluting a colloidal silica sol commercially available with proper solvent. An example of such diluent is a mixture of pure water and methanol which may be used irrespective of the kinds of the silica sol commercially available.

The rate of methanol in the mixed solvent is preferably high so far as the stability of the colloidal silica sol is not adversely affected. More specifically, this makes it possible to reduce the drying load and to lower the surface tension of the coating solution and thus the solution can be uniformly coated. The content of $SiO_2$ in the coating solution preferably ranges from 0.002 to 4.0% by weight. The amount of the colloidal silica sol to be coated preferably ranges from 0.5 $mg/m^2$ to 1.0 $g/m^2$ and particularly 1 to 500 $mg/m^2$. This is because if it is less than 0.5 $mg/m^2$, the adhesion between the primer layer and the substrate is not improved, while if it exceeds 1.0 $g/m^2$, the flexibility of the film is impaired and hence the coated film is easily cracked during handling the plate.

Alternatively, the adhesion between the substrate and the primer layer can further be enhanced by surface-treating the substrate with the foregoing silane coupling agent. In this surface-treatment, the silane coupling agent is in general used in the form of an aqueous solution having a concentration ranging from 0.1 to 3% by weight, but a sufficient improvement in the adhesion can also be ensured even if the silane coupling agent is used at a concentration lower than that defined above depending on the kinds of the silane coupling agents used and the treating time. Moreover, organic solvents such as U alcohols may be used as diluents in addition to water. Further, the solubility of the silane coupling agents hardly soluble in water can be improved by addition Of an acid to water. A substrate is dipped in the solution of a silane coupling agent thus prepared and air dried as such or after wiping out the solution remaining on the substrate with a rubber squeegee or the like. Subsequently, the substrate is optionally washed with water and/or subjected to a heat-treatment to thus give a substrate having high adhesion to the primer layer. Alternatively, substrates having high adhesion to the primer layer may likewise be obtained by coating the substrate with a solution of a silane coupling agent followed by drying or by spraying the solution onto the surface of the substrate which has been heated in advance. The amount of the silane coupling agent to be coated suitably ranges from 10 $mg/m^2$ to 100 $mg/m^2$ (weighed after drying).

PRIMER LAYER

In the present invention, the primer layer comprises the foregoing compound carrying urethane or/and urea bonds. If the foregoing silane coupling agent is not applied to the surface of the substrate, the foregoing silane coupling agent is added to the primer layer. The primer layer may further comprise an urethane resin or a polyamide resin which is usually incorporated into the light-sensitive layer. The mixing ratio of the compound carrying urethane Or/and urea bonds to these additives ranges from 1:10 to 1:0 and preferably 1:5 to 1:0.

Moreover, the primer layer may comprise monomers carrying a polyfunctional isocyanate group such as Takenate D1104 (made by Takeda Chemical Industries, Ltd.) and Crysvon NX (made by Dainippon Ink and Chemicals, Inc.). The addition thereof makes the adhesion of the primer layer to the substrate stronger.

The primer layer may further comprise, depending on purposes, dyes, pH indicators, printing out agents, photopolymerization initiators, auxiliary agents for adhesion such as polymerizable monomers, diazo resins, silane coupling agents, titanate coupling agents, aluminum coupling agents, isocyanate compounds and carboxyl group-containing resins and additives such as white pigments and silica powder. The amount of the primer layer coated ranges from 0.5 to 20 $g/m^2$ (on dry basis).

LIGHT-SENSITIVE LAYER

The photopolymerizable light-sensitive layer used in the invention comprises (i) a monomer or an oligomer having at least one photopolymerizable olefinically unsaturated double bond; (ii) an organic solvent-soluble polyurethane resin or polyamide resin which is solid at room temperature and has film-forming ability; (iii) a photopolymerization initiator; and (iv) optionally other organic solvent-soluble polymeric compounds having film-forming ability.

Each component of the light-sensitive layer will be explained below in more detail.

Component (i): monomer or oligomer having at least one photopolymerizable olefinically unsaturated double bond As the foregoing monomers or oligomers usable in the present invention, there may be mentioned, for instance, monofunctional (meth)acrylates such as polyethylene glycol mono(meth)acrylate, polypropylene glycol mono(meth)acrylate, phenoxyethyl (meth)acrylate, -(meth)acryloxyethyl hydrogen phthalate and 2-(meth)acryloxyethyl hydrogen succinate; polyethylene glycol di(meth)acrylate, polypropylene glycol di(meth)acrylate, trimethylolethane tri(meth) acrylate, neopentyl glycol di(meth)acrylate, pentaerythritol tri(meth) acrylate, pentaerythritol tetra(meth)acrylate, dipentaerythritol hexa(meth)acrylate, hexanediol di(meth)acrylate, trimethylolpropane tri(acryloyloxypropyl) ether, tri(acryloyloxyethyl) isocyanurate, calcium (meth)acrylate and sodium (meth)acrylate; those obtained by adding ethylene oxide or propylene oxide to polyfunctional alcohols such as glycerin and trimethylolethane and then converting the adduct into (meth)acrylates; urethane acrylates such as those disclosed in J. P. KOKOKU Nos. Sho 48-41708 and Sho 50-6034 and J. P. KOKAI No. Sho 51-37193; polyester acrylates as disclosed in J. P. KOKAI No. Sho 48-64183 and J. P. KOKOKU Nos. Sho 49-43191 and Sho 52-30490; polyfunctional (meth)acrylates such as epoxy acrylates obtained by reacting epoxy resins with (meth)acrylic acid; and N-methylolacrylami de derivatives as disclosed in U.S. Pat. No. 4,540,649. In addition, it is also possible to use those disclosed in Journal of the Adhesive Society of Japan, vol. 20, No. 7, pp. 300-308 (1984) as photohardenable monomers and oligomers. Moreover, examples of the monomers or oligomers also include reaction products of allyl isocyanate or a compound:

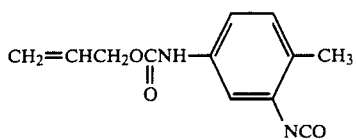

with (meth)acrylate compounds carrying a hydroxyl group such as hydroxyethyl (meth)acrylate, hydroxypropyl (meth)acrylate, Polyethylene glycol mono(meth)acrylate, polypropylene glycol mono(meth)acrylate, pentaerythritol tri(meth)acrylate, dipentaerythritol tetra(meth)acrylate, compounds of the following formulae:

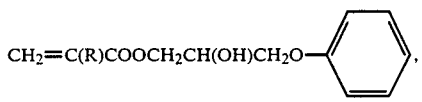

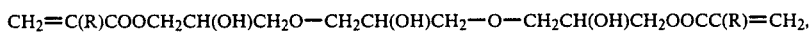

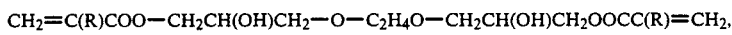

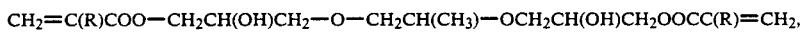

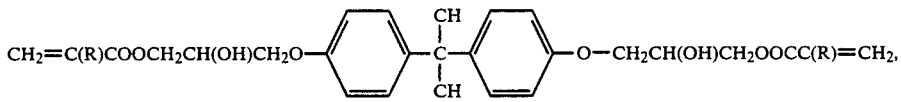

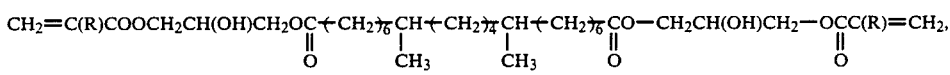

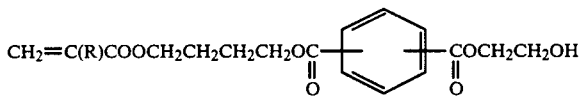

(wherein R represents a hydrogen atom or a methyl group); reaction products of allyl glycidyl ether with (methy)acrylate compounds carrying a carboxyl group such as (meth)acrylic acid, (meth) acryloxyethyl hydrogen phthalate, (meth)acryloxyethyl hydrogen succinate, (meth)acryloxyethyl hydrogen maleate, (meth)acryloxyethyl hydrogen tetrahydrophthalate and (meth)acryloxyethyl hydrogen hexahydrophthalate; reaction products of allyl alcohols or 2-allyloxyethyl alcohols with the foregoing (meth)acrylate compounds carrying a carboxyl group or an acid chloride thereof; and reaction products of amino compounds such as xylylenediamine, ethylenediamine, isophoronediamine or monoethanolamine with glycidyl methacrylate or allyl glycidyl ether.

Component (ii): Organic solvent-soluble polyurethane resin or polyamide resin which is solid at room temperature and has film-forming ability The foregoing polyurethane resins usable in the invention are basically those obtained by reacting a diisocyanate with approximately equimolar amount of a diol or those obtained by reacting a diol with a slight excess of a diisocyanate and then subjecting the reaction product to a chain extending reaction with a diamine, a diol or water. Examples of diisocyanates include toluenediisocyanate, xylylenediisocyanate, diphenylmethanediisocyanate, hexamethylenediisocyanate, isophoronediisocyanate, diphenyl ether diisocyanate, hydrogenated xylylenediisocyanate, cyclohexanediisocyanate, hydrogenated diphenylmethanediisocyanate, tetramethylxylenediisocyanate and lysinediisocyanate; and typical examples of diols are polypropylene glycol, polyethylene glycol, polytetramethylene glycol, ethylene oxide-propylene oxide copolymer, tetrahydrofuran ethylene oxide copolymer, tetrahydrofuran-propylene oxide copolymer, polyesterdiol such as polyethylene adipate, polydiethylene adipate, polypropylene adipate, polyhexamethylene adipate, polyneopentyl adipate, polyhexamethyleneneopentyl adipate, polyethylenediethylene adipate and polyethylenehexamethylene adipate; poly-$\epsilon$-caprolactonediol, polyhexamethylenecarbonatediol and polytetramethylene adipate.

In addition, branched polyurethane resins can also be used and examples thereof are those obtained by replacing a part or all of the diisocyanate with isocyanate compounds having at least three functional groups such as those obtained by adding three moles of 2,4-toluenediisocyanate to one mole of trimethylolpropane, undecanetriisocyanate, dicycloheptanetriisocyanate, 1,8-diisocyanate-4-isocyanatemethyloctane, and simultaneously replacing a part of the diol component with monofunctional monoalcohols such as allyl alcohol, allyloxyethyl alcohol, hydroxyethyl (meth)acrylate, polyethylene glycol mono(meth)acrylate, polypropylene glycol (meth)acrylate, hydroxypropyl mono(meth)acrylate, benzyl alcohol or ethyl alcohol to thus introduce functional groups.

Besides, useful examples further include polyurethane resins derived from diol components having a special functional group such as alkyldialkanolamine, (meth)acrylate group-containing diols and carboxyl group-containing diols. In particular, it is also possible to obtain alkaline water-soluble polyurethane resins by using carboxyl group-containing diols as disclosed in J. P. KOKAI Nos. Sho 63-287942 and Sho 63-287943.

The polyamide resins usable in the invention may be, for instance, known copolymerized polyamides soluble in an organic solvent such as an alcohol and N substituted polyamides. More specifically, there may be mentioned, for instance, copolymerized amides such as binary copolymers comprising a polycapramide component (nylon 6 component) and a polyhexamethyleneadipamide component (nylon 66 component) (nylon 6/nylon 66 copolymers), copolymers obtained by copolymerizing nylon 6 and nylon 66 components with polyhexamethylenesebacamide component (nylon 610 component) (nylon 6/nylon 66/nylon 610 copolymers), nylon 6/66/12 copolymers, nylon 6/66/PACM 6 copolymers and nylon 6/66/PACM-8 copolymers obtained by copolymerizing nylon 6 and nylon 66 components with a third component such as polylauroamide component (nylon 12 component), poly-di(p-aminocyclohexyl) methaneadipamide component (nylon PACM-6 component) or poly di(paminocyclohexyl)-methanesuberamide component (nylon PACM-8 component); as well as N-methylol, N-alkoxymethyl or N-allyloxymethyl derivatives of a variety of polyamides. Besides, also useful are those obtained by copolymerizing 1,3-bis(aminomethyl)cyclohexane and cyclohexane-1,4-dicarboxylic acid with the aforementioned amide components as disclosed in J. P. KOKAI No. Sho 51-74704.

As water-soluble or water-dispersible polyamide resins, there may be mentioned, for instance, polyamides carrying sulfonic acid groups or sulfonate groups obtained by copolymerizing sodium 3,5-dicarboxybenzenesulfonate or the like as disclosed in J. P. KOKAI No. Sho 48-72250; polyamides having ether bonds obtained by copolymerizing one of dicarboxylic acids, diamines and cyclic amides having an ether bond in the molecule as disclosed in J. P. KOKAI No. Sho 49-43565; polyamides having basic nitrogen atoms obtained by copolymerizing N,N'-di(γ-aminopropyl)piperadine or the like and polyamides obtained by quaternizing the polyamides having basic nitrogen atoms with acrylic acid or the like as disclosed in J. P. KOKAI No. Sho 50-7605; copolymerized polyamides containing polyether segments having a molecular weight ranging from 150 to 1,500 as disclosed in J. P. KOKAI No. Sho 55-74537; and polyamides obtained by ring opening polymerization of $\alpha$-(N,N'-dialkylamino)-$\epsilon$-caprolactam or $\alpha$-(N,N'-dialkylamino)-$\epsilon$-caprolactam and $\epsilon$-caprolactam. Other useful polyamide resins are, for instance, products obtained by addition polymerizing organic diisocyanate compounds with amide compounds both ends of which are substantially primary and/or secondary amido groups and which have at least one amido bond.

Component (iii): Photopolymerization Initiator

Typical examples of the photopolymerization initiators usable in the present invention are as follows:

(iii-1) Benzophenone derivatives such as benzophenone, Michler's ketone, xanthone, anthrone, thioxanthone, acridone, 2-chloroacridone and 2-chloro-N-n-butylacridone;

(iii-2) Benzoin derivatives such as benzoin, benzoin methyl ether and benzoin ethyl ether;

(iii-3) Quinones such as p-benzoquinone, $\beta$-naphthoquinone and $\beta$-methylanthraquinone;

(iii-4) Sulfur atom-containing compounds such as dibenzyldisulfide and di-n-butyldisulfide;

(iii-5) Azo or diazo compounds such as 2-azo-bis-isobutyronitrile, 1-azo-bis-1-cyclohexanecarbonitrile, p-diazobenzylethylaniline and Congo Red;

(iii-6) Halogen atom-containing compounds such as carbon tetrabromide, silver bromide, $\alpha$-chloromethylnaphthalene and trihalomethyl-s-triazine compounds; and (iii-7) Peroxides such as benzoyl peroxide.

The amount of the photopolymerization initiator to be added to the light-sensitive layer ranges from 0.1 to 20% by weight and preferably 3 to 15% by weight on the basis of the total weight of the composition of the light-sensitive layer.

Component (iv): Polymeric Compounds Having Film-Forming Ability Other Than Component (ii)

Examples of the optional other organic solvent-soluble polymeric compounds having film-forming ability used in the present invention are methacrylic acid copolymers, acrylic acid copolymers, crotonic acid copolymers, maleic acid copolymers, partially esterified maleic acid copolymers, acidic cellulose derivatives, polyvinylpyrrolidone, polyethylene oxide, polyester, unsaturated polyester, polystyrene, epoxy resins, phenoxy resins, polyvinyl butyral, polyvinyl formal, polyvinyl chloride, polyvinyl alcohol, polyvinyl alcohol partially converted into acetal, gelatin and water-soluble cellulose derivatives.

In addition, examples of the polymeric compounds carrying, on the side chains, photopolymerizable or photocrosslinkable and olefinically unsaturated double bonds include allyl (meth)acrylate-co(meth)acrylic acid co-optional other addition-polymerizable vinyl monomers and alkali metal salts or amine salts thereof as disclosed in J. P. KOKAI No. Sho 59-53836 (U. S. Pat. No. 4,687,727); those obtained by reacting hydroxyethyl (meth)acrylate-co-acrylic acid-co-alkyl (meth)acrylate and alkali metal salts or amine salts thereof with (meth)acrylic acid chloride as disclosed in J. P. KOKOKU No. Sho 59-45979; those obtained by adding, through half-esterification, pentaerythritol triacrylate to maleic anhydride copolymers and alkali metal salts or amine salts thereof as disclosed in J. P. KOKAI No. Sho 59-71048 (U.S. Pat. No. 4,537,855); those obtained by adding, through half-esterification, monohydroxyalkyl (meth)acrylate, polyethylene glycol mono(-meth)acrylate or polypropylene glycol mono(meth)acrylate to styrene-co-maleic acid anhydride and alkali metal salts or amine salts thereof; those obtained by reacting a part of carboxyl groups of (meth)acrylic acid copolymers or crotonic acid copolymers with glycidyl (meth)acrylate and alkali metal salts or amine salts thereof; those obtained by reacting hydroxyalkyl (meth)acrylate copolymers, polyvinyl formals or polyvinyl butyrals with maleic anhydride or itaconic anhydride and alkali metal salts or amine salts thereof; those obtained by reacting hydroxyalkyl (meth)acrylate co(-meth)acrylic acid with an adduct: 2,4-tolylenediisocyanate/hydroxy alkyl (meth)acrylate (1:1) and alkali metal salts or amine salts thereof; (meth)acrylic acid copolymer which is partially reacted with allyl glycidyl ether and alkali metal salts or amine salts thereof as disclosed in J. P. KOKAI No. Sho 59 53836; vinyl (meth)acrylate-co(meth)acrylic acid and alkali metal salts or amine salts thereof; allyl (meth)acrylate-co-sodium styrenesulfonate; vinyl (meth) acrylate-co-sodium styrenesulfonate; allyl (meth)acrylate co-sodium acrylamido-1,1-dimethylethylenesufonate; vinyl (meth)acrylate-co-sodium acrylamido-1,1-dimethylethylenesulfonate; 2-allyloxyethyl methacrylate-co-methacrylic acid; and 2-allyloxyethyl methacrylateco-2-methacryloxyethy hydrogen succinate.

The ratio of the total amount of the components (ii) and (iv) to that Of the monomer of component (i) preferably ranges from 99:1 to 30:70 and more preferably 97:3 to 50:50.

OTHER COMPONENTS OF THE PHOTOPOLYMERIZABLE LIGHT-SENSITIVE LAYER

In addition to the foregoing components, the photopolymerizable light-sensitive layer may preferably comprise a heat polymerization inhibitor and useful examples thereof are hydroquinone, pmethoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole. In addition, the light-sensitive layer may optionally comprise dyes and/or pigments for coloring the layer as well as pH indicators and/or leuco dyes as printing out agents. It is also possible to incorporate, into the photopolymerizable light sensitive layer, a small amount of a silicone compound selected from the group consisting of polydimethylsiloxane, methylstyrene-modified polydimethylsiloxane, olefin-modified polydimethylsiloxane, polyether-modified polydimethylsiloxane, silane coupling agents, silicone diacrylates and silicone dimethacrylates. The photopolymerizable light-sensitive layer may further comprise fluorine atom-containing surfactants in order to improve coating properties of the light-sensitive composition. A diazo resin may be added to the light-sensitive layer for improving the adhesion between the photopolymerizable light sensitive layer and the primer layer. The amounts of these additives each is in general not more than 10% by weight on the basis of the total weight of the photopolymerizable light-sensitive layer. In order to enhance the sensitivity of the photopolymerizable light-sensitive layer per se, it is possible to incorporate, into the layer, other radical generating agent such as hexaarylbiimidazole as disclosed in J. P. KOKAI Nos. Sho 61-123603 and Sho 57-21401 and U.S. Pat. No. 4,565,769 in an amount ranging from 0.5 to 10% by weight on the basis of the total weight of the light-sensitive layer. Besides, it is also possible to add, to the photopolymerizable light-sensitive layer, silica powder or hydrophobic silica powder whose surface is treated with a silane coupling agent carrying a (meth)acryloyl or aryl group in an amount of not more than 50% by weight on the basis of the total weight of the photopolymerizable light-sensitive layer to enhance the adhesion of the light-sensitive layer to a silicone rubber layer which is subsequently applied thereto and will be detailed below.

The composition for the foregoing photopolymerizable light sensitive layer is dissolved in a proper solvent or any combination thereof such as 2-methoxyethanol, 2-methoxyethyl acetate, methyl lactate, ethyl lactate, propylene glycol monomethyl ether, methanol, ethanol, methyl ethyl ketone, water or a combination thereof and then applied onto the surface of a substrate. The amount thereof coated suitably ranges from about 0.1 to 10 g/m², preferably 0.5 to 5 g/m² (weighed after drying).

SILICONE RUBBER LAYER

The crosslinked silicone rubber layer used in the present invention is a layer of partially or completely crosslinked polydiorganosiloxane comprising the following repeating units:

wherein R represents a monovalent group such as an alkyl, aryl or alkenyl group or a combination thereof which may have functional groups selected from the group consisting of halogen atoms, amino groups, hydroxyl group, alkoxy groups, aryloxy groups, (meth)acryloxy groups and thiol groups. The silicone rubber layer may optionally comprise fine powder of a substance such as silica, calcium carbonate or titanium oxide; an auxiliary agent for adhesion such as the aforementioned silane coupling agents, titanate coupling agents or aluminum coupling agents; and/or a photopolymerization initiator.

Polysiloxanes having functional groups at the ends thereof and a molecular weight of from several thousands to several hundreds of thousand are in general used as starting materials for polymers (silicone rubbers) having the foregoing polysiloxane chain as the main skeleton. The silicone rubber layer can be obtained by crosslinking and hardening the starting material in accordance with the following method. In other words, the silicone rubber layer can be obtained by mixing the foregoing polysiloxane having hydroxyl group(s) at either or both of the ends thereof with a silane coupling agent represented by the following general formula, adding, if necessary, an organic compound such as organotin compound, an inorganic acid or an amine as a catalyst and condensing and hardening the polysiloxane and the silane coupling agent with heating or at room temperature:

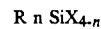

wherein n is an integer of 1 to 3; R is the same as that defined above; and X represents a substituent such as —OH, —OR², —OAc, —O—N=CR²R³, —Cl, —Br or —I (wherein R² and R³ may be the same or different and each has the same meaning as that for R defined above and Ac represents an acetyl group).

Alternatively, the silicone rubber layer may be obtained by condensing and hardening the organopolysiloxane carrying hydroxyl group(s) at the ends thereof, a hydrogen polysiloxane crosslinking agent and an optional silane coupling agent defined above.

Useful examples of the silicone rubber layer further include addition type silicone rubber layer obtained by crosslinking ≡SiH groups and —CH=CH—groups through an addition reaction. The addition type silicone rubber layer is rather unaffected by humidity during hardening the same, undergoes crosslinking at high speed and hence a crosslinked silicone rubber layer having predetermined physical properties can easily be formed. Regarding the condensed silicone rubber layer, if a carboxylic acid is present in the photopopolymerizable light-sensitive layer, the hardening becomes insufficient depending on the kind of the crosslinking agent used, while if the addition type silicone rubber layer is employed, it is sufficiently hardened even if a carboxylic acid is present in the photopolymerizable light-sensitive layer. As has been explained above, the photopolymerizable light-sensitive layer may comprise a carboxylic acid in the latter case and hence the PS plate can be developed with a developer mainly comprising water of an alkaline water. Therefore, the PS plate can easily be designed. The addition type silicone rubber layer herein used can be obtained through a reaction of polyvalent hydrogen organopolysiloxane with a polysiloxane compound having two or more —CH=CH—bonds in the molecule and desirably those obtained by hardening and crosslinking a composition comprising the following components:

(1) 100 parts by weight of an organopolysiloxane having at least two alkenyl groups (preferably a vinyl group) which are directly bonded to the silicon atom per molecule;

(2) 0.1 to 1,000 parts by weight of an organo hydrogen polysiloxane having at least two SiH bonds per molecule; and (3) 0.00001 to 10 parts by weight of a catalyst for addition polymerization.

The alkenyl group of Component (1) may be present either in the middle of or at the ends of the molecular chain and the organopolysiloxane may have organic substituents other than the alkenyl group, such as substituted or unsubstituted alkyl and/or aryl groups. Component (1) may contain a small number of hydroxyl groups. Component (2) is reacted with Component (1) to form a silicone rubber layer and serves to impart, to the silicone rubber layer, adhesion to the photopolymerizable light-sensitive layer. The hydrogen atom of Component (2) may be present in the middle of or at the end of the molecular chain and Component (2) may also have organic groups selected from the group consisting of those defined above in connection with Component (1). It is preferred that at least 60% of the organic groups of Components (1) and (2) be methyl groups from the viewpoint of ink repellency of the resulting silicone rubber layer. Components (1) and (2) may have a linear, cyclic or branched structure and the molecular weight of at least one of them preferably exceeds 1,000 from the viewpoint of physical properties of the rubber layer and more preferably the molecular weight of Component (1) exceeds 1,000.

Examples of Component (1) are α, ω- divinylpolydimethyl siloxane and methylvinyl siloxane-co dimethylsiloxane having methyl groups at both ends; those of Component (2) are polydimethylsiloxane having hydrogen atoms at both ends, α, ω-dimethylpolymethyl hydrogen siloxane, methyl hydrogen siloxane-co dimethylsiloxane having methyl groups at both ends and cyclic polymethyl hydrogen siloxane.

The addition catalysts, Component (3), may be selected from any known ones, but platinum compounds are particularly preferred and examples thereof are elemental platinum, platinum chloride, chloroplatinic acid and platinums coordinated with olefins.

The composition for obtaining the silicone rubber layer may optionally comprise a crosslinking inhibitory agent such as a vinyl group-containing organopolysiloxane (e.g., tetracyclo(methylvinyl) siloxane), a carbon-carbon triple bond-containing alcohol, acetone, methyl ethyl ketone, methanol, ethanol or propylene glycol monomethyl ether for controlling the hardening speed of the composition.

These compositions undergo an addition reaction and thus start hardening as soon as the foregoing three components are mixed together. In this respect, the hardening speed is rapidly increased as the reaction temperature is elevated. Therefore, it is preferred that the composition be maintained under a high temperature condition at which the properties of the substrate and the photopolymerizable light-sensitive layer are not changed till the composition is completely hardened for the purpose of shortening the time for hardening it on the light-sensitive layer and for extending the pot life thereof. Thus, stable adhesion between the rubber layer and the light-sensitive layer can be ensured.

In addition to the foregoing components, the composition for the silicone rubber layer may comprise a known-adhesion-imparting agent such as an alkenyl trialkoxysilane or those represented by the following formulae:

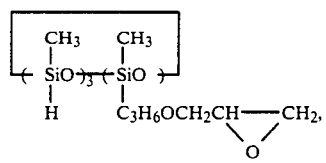

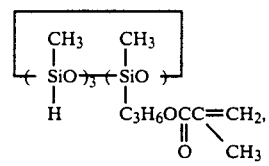

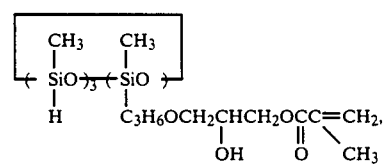

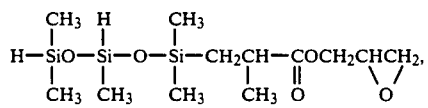

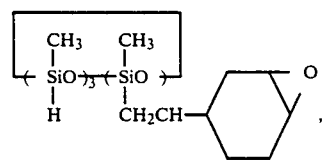

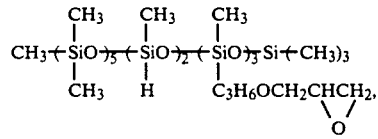

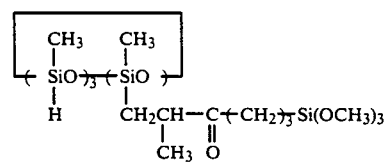

and a hydroxyl group-containing organopolysiloxane, a silicone oil consisting of dimethylpolysiloxane whose end is a trimethylsilyl group, dimethylpolysiloxane having a trimethylsilyl group at the end, a silicone oil consisting of a phenylmethylpolysiloxane copolymer and/or hydrolyzable functional group-containing silane (or siloxane) which are components of the condensed silicone rubber layers. Moreover, a known filler such as silica may be added to the composition in order to improve the strength of the resulting silicone rubber layer.

In the present invention, the silicone rubber layer ultimately serves as an ink repellent layer. If the thickness thereof is too small, the ink repellency thereof is lowered and the resulting layer is easily damaged. On the other hand, if the thickness is too great, the developability of the resulting PS plate is impaired. Thus, it preferably ranges from 0.5 to 5 μm.

In the dry PS plate explained above, it is also possible to apply a variety of other silicone rubber layers on the foregoing silicone rubber layer. An adhesive layer may be applied between the photopolymerizable light-sensitive layer and the silicone rubber layer for preventing poisoning by the catalyst present in the composition and for enhancing the adhesion between the photopolymerizable light-sensitive layer and the silicone rubber layer.

A polymer coating may be applied onto the surface of the silicone rubber layer or a polymer film may be laminated with the silicone rubber layer for protecting the surface of the silicone rubber layer. Examples of such polymer coatings or films are transparent films or coatings such as polyethylene, polypropylene, polyvinyl chloride, polyvinylidene chloride, polyvinyl alcohol, polyethylene terephthalate and cellophane films or coatings.

The dry PS plate of the present invention is first imagewise exposed to light through an original transparency and then developed with a developer capable of dissolving a part of or swelling a part or whole of the image portions on the photopolymerizable light-sensitive layer or a developer capable of swelling the silicone rubber layer. In this case, both the imagewise exposed portions on the light-sensitive layer and the silicone rubber layer thereon or only the silicone rubber layer of the image portions are removed, dependent upon the strength of the developer.

The developer suitably used in the present invention may be any known ones for developing dry PS plates. Examples thereof include aliphatic hydrocarbons such as hexane, heptane, "Isopar E, H and G" (trade names of the aliphatic hydrocarbons available from ESSO CHEMICAL CO., LTD.), gasoline and kerosine, aromatic hydrocarbons such as toluene and xylene, and halogenated hydrocarbons such as trichloro ethylene, to which the following polar solvent is added; as well as the polar solvents per se.

Alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monohexyl ether, polyethylene glycol monomethyl ether, propylene glycol, tripropylene glycol, polypropylene glycol, triethylene glycol and tetraethylene glycol;

Ketones such as acetone and methyl ethyl ketone;

Esters such as ethyl acetate, methyl lactate, ethyl lactate, butyl lactate, propylene glycol monomethyl ether acetate, carbitol acetate, dimethyl phthalate and diethyl phthalate; and Other Polar Solvents such as triethyl phosphate and tricresyl phosphate.

It is also possible to use, as a developer, the foregoing organic solvent type developers to which water is added; those obtained by solubilizing the foregoing organic solvent in water with the aid of a surfactant; those obtained by adding, to the foregoing developers, an alkaline agent such as sodium carbonate, monoethanolamine, diethanolamine, triethanolamine, sodium silicate, potassium silicate, sodium hydroxide, potassium hydroxide or sodium borate; or optionally tap water per se or an alkaline water.

In the present invention, a dye such as Crystal violet or Astrazone Red can be added to a developer to dye the image simultaneously with the development.

The development of the dry PS plate of the present invention can be performed by any known method, for instance, by rubbing the plate surface with a pad for development containing the foregoing developer or by pouring a developer onto the plate surface and then rubbing the surface with a brush for development in water. Thus, the silicone rubber layer and the light-sensitive layer on the image areas are removed, the surface of the substrate or the primer layer is exposed and serves as an ink receiving part, or only the silicone rubber layer is removed and the light-sensitive layer is exposed and serves as an ink receiving part.

The exposed image areas (or light-sensitive layer) is dyed with a dyeing solution to inspect the resulting Plate to thus evaluate the image-forming ability of the plate. Only the exposed areas on the light-sensitive layer are dyed by lightly rubbing the image Portions with a soft pad containing the dyeing solution. This makes it possible to confirm whether even the highlight portions on the image areas are sufficiently developed or not. The dyeing solution used comprises, for instance, at least one member selected from the group consisting of water-soluble disperse dyes, acid dyes and basic dyes which are dissolved or dispersed in a solvent selected from the group consisting of water, alcohols, ketones, ethers and mixture thereof. It is also effective to incorporate carboxylic acids, amines, surfactants and/or dyeing aids to enhance the dyeing properties of the solution.

In the dry PS plate of the present invention, the adhesion strength between the substrate and the light sensitive layer is substantially improved, the adhesion is surely maintained even after imagewise exposure to light and the subsequent development. The dry PS plate shows excellent image reproduction and the resulting dry lithographic plate is excellent in printing durability as well as resistance to scratch.

The present invention will hereinafter be explained in more detail with reference to the following non-limitative working Examples and Preparation Examples. Moreover, the practical effects achieved by the invention will also be discussed in detail in comparison with Comparative Examples.

PREPARATION EXAMPLES 1 to 3

Preparation of Urethane and Urea Bonds Containing Compound 40.06 Parts by weight of a commercially available polyester polyol (OD-X-105: adipic acid/ethylene glycol/1,4-butanediol condensate (molecular weight=2,000); available from DAINIPPON INK AND CHEMICALS, INC.), 3.25 parts by weight of 1,4-butanediol (BG) and 23.34 parts by weight of isophoronediisocyanate (IpDI) were dissolved in 54.53 parts by weight of dimethylacetamide and addition polymerized at 90° C. for 6 hours. Further, 1.71 parts by weight of isophoronediamine (IpDA) as a chain extender was added to the reaction system and the reaction was continued at 90° C. for 2 hours to complete the reaction.

The amount of isocyanate group remaining in the reaction product was determined according to JIS K7301-1985.

The composition of the polyurethaneurea thus prepared is shown in the column of Prep. Ex. 1 appearing in the following Table I as the charge stock ratio (molar ratio).

The same procedures used in Preparation Example 1 were repeated in Preparation Example 2 (Prep. Ex. 2) except for using the charge stock ratio (molar ratio) shown in Table I (in the column of Prep. Ex. 2).

In Preparation Example 3, the compound prepared in Preparation Example 1 (polyurethaneurea having residual isocyanate groups) was reacted with an equimolar amount of a monoethanolamine (EtA) capable of reacting with the isocyanate groups to obtain an alcohol residue. containing polyurethaneurea.

TABLE I

|  | IpDI | OD-X-105 | BG | IpDA | EtA |
|---|---|---|---|---|---|
| Prep. Ex. 1 | 1 | 0.2 | 0.4 | 0.1 | 0 |
| Prep. Ex. 2 | 1 | 0.2 | 0.4 | 0.4 | 0 |
| Prep. Ex. 3 | 1 | 0.2 | 0.4 | 0.1 | 0.6 |

Each numerical value represents each corresponding charge stock ratio (molar ratio).

Preparation of Dry PS plate

1. Application of Primer Layer

Solutions having formulations 1, 3, 4, 7 and 8 shown in Table II (Examples) and those having formulations 2, 5, 6, 9, 10 and 11 (Comparative Examples) likewise shown in Table II were applied, with a spin coat, onto the surface of aluminum plates which had been degreased in the usual manner and then heated at 140 ° C. for 2 minutes to form each corresponding primer layer in an amount of 2 g/m² (weighed after drying).

After immersing an aluminum plate which had likewise been degreased in a 1% aqueous solution of γ-aminopropyltriethoxysilane for 10 seconds, the surface of the aluminum plate was sufficiently wiped out with a rubber squeegee, the plate was washed with water and air-dried. Then solutions having formulations 2, 5, 6, 9 and 10 (Examples) shown in Table II were applied, with a spin coat, onto the surface of the aluminum plates and then heated at 140° C. for 2 minutes to form each corresponding primer layer in an amount of 2 g/m² (weighed after drying).

TABLE II

| Formulation | 1 | 2 | 3 | 4 | 5 | 6 | 7 | 8 | 9 | 10 |
|---|---|---|---|---|---|---|---|---|---|---|
| Polymer of Prep. Ex. 1 | 3.6[1] | 3.6[1] | | | | | | | | |
| Polymer of Prep. Ex. 2 | | | 3.6[1] | 3.6[1] | 3.6[1] | 3.6[1] | | | | |
| Polymer of Prep. Ex. 3 | | | | | | | 3.6[1] | 3.6[1] | 3.6[1] | 3.6[1] |
| Takenate D1104[2] | | | | 0.01 | | 0.01 | | 0.1 | | 0.1 |
| KBM 603[3] | 0.2 | | 0.2 | 0.2 | | | 0.2 | 0.2 | | |
| Methyl ethyl ketone | 60 | 60 | 60 | 60 | 60 | 60 | 60 | 60 | 60 | 60 |

[1] Weight of the solids contents.
[2]

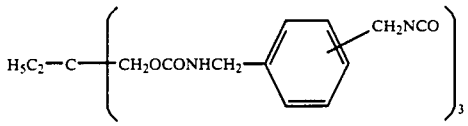

[3] $H_2NC_2H_4NHC_3H_6Si(OCH_3)_3$ (available from Shin-Etsu Chemical Co., Ltd.).

sponding primer layer in an amount of 2 g/m² (weighed after drying).

Primer Formulation 11:

| Component | Amount (part by weight) |
|---|---|
| Epoxy resin (Epikote 1007; available from Shell Petrochemical Co., Ltd.) | 10 |
| Ethyl cellosolve acetate | 40 |
| Ethyl cellosolve | 40 |
| Butyl cellosolve | 20 |

2. Application of Light-Sensitive Layer

A solution of a light-sensitive composition having a formulation shown in Table III was applied onto each primer layer formed above with a spin coat and dried to form a light-sensitive layer. The amount of the layer coated was 3 g/m² (weighed after drying).

TABLE III

| Formulation of the Light-sensitive Layer | |
|---|---|
| Component | Amount (part by weight) |
| Polymer of Prep. Ex. 2 (weight of the solid content) | 1.5 |
| Ethyl Michler's ketone | 0.14 |
| 2-Chlorothioxanthone | 0.10 |
| Reaction product of metaxylylenediamine with glycidyl methacrylate (molar ratio = 1:4) | 0.9 |
| $CH_2=CHCOO(CH_2CH_2O)_{14}COCH=CH_2$ | 0.6 |
| Victoria Pure Blue NPS (available from HODOGAYA CHEMICAL CO., LTD.) | 0.01 |
| Defenser MCF 323 (available from DIC Co., Ltd.; surfactant) | 0.005 |
| Methyl ethyl ketone | 5 |
| Propylene glycol monomethyl ether | 30 |

3. Application of Silicone Rubber Layer

A solution for forming silicone rubber layer having the composition as shown in the following Table IV was applied onto each light-sensitive layer in an amount of 2.0 g/m² (on dry basis) and then dried to form a silicone rubber layer for each PS plate.

TABLE IV

| Component | Amount (part by weight) |
|---|---|
| Dimethylpolysiloxane having vinyl groups on both ends | 9 |
| Dimethylpolysiloxane having methyl groups on both ends | 1.67 |
| SiH group-containing crosslinking agent | 1.0 |

TABLE IV-continued

| Component | Amount (part by weight) |
|---|---|
| Platinum catalyst | 0.1 |
| Isopar G | 160 |

A matted biaxially oriented polypropylene (OPP) film having a thickness of 9μm was laminated with the silicone rubber layer of each dry PS plate. Thus, dry PS plates of Examples 1 to 10 and Comparative Examples 1 to 6 were obtained. A positive film was put on each dry PS plate thus prepared, brought in close contact with the latter under vacuum and the assembly was exposed to light with the usual exposure machine. Then the laminate film was peeled off and the exposed PS plate was immersed in polypropylene glycol (molecular weight=200) maintained at 40° C. for one minute. After the immersion, the processing solution adhered to the plate surface and the reverse face was removed with a rubber squeegee and then the plate surface was lightly rubbed with a pad while spraying tap water on the surface to remove the silicone rubber layer on the image areas. Subsequently, the plate was dyed with a solution for dyeing having a composition as defined in the following Table V to evaluate the adhesion between the substrate (S) and the primer layer (P) and that between the primer layer (P) and the light-sensitive layer (L). The results thus obtained are summarized in Table VI.

TABLE V

| Component | Amount (part by weight) |
|---|---|
| Crystal Violet | 0.1 |
| Carbitol | 14.0 |
| Pionin D-310 (available from TAKEMOTO FATS & OIL CO., LTD.)*1 | 0.5 |
| Newcoal B4SN (available from Nippon Emulsifying Agent Manufacturing Co., Ltd.)*2 | 1.8 |
| Pure water | 83.1 |

*1

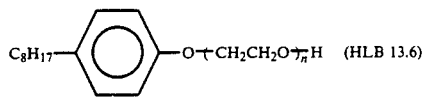

*2

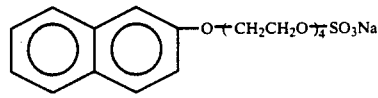

Each plate thus obtained was put on a KOMORI LITHLONE 26 printing press from which the device for supplying dampening water had been dismantled, then printing operations were performed till 60,000 printed matters were obtained using Aqualess V-G Sumi Ink (available from Toyo Ink Manufacturing Co., Ltd.) and the resistance to scratch of these dry lithographic plates was evaluated according to the following 5-stage evaluation standard. The results thus observed are summarized in Table VI.

TABLE VI

Results of Evaluation

| | Ex. No. | | | | | | | | | |
|---|---|---|---|---|---|---|---|---|---|---|
| | 1 | 2 | 3 | 4 | 5 | 6 | 7 | 8 | 9 | 10 |
| Formulation of P[1)] | 1 | 2 | 3 | 4 | 5 | 6 | 7 | 8 | 9 | 10 |
| Treatment of S[2)] with Silane Coupling Agent | No | Yes | No | No | Yes | Yes | No | No | Yes | Yes |
| Adhesion between P and S | ⊚ | ⊚ | ○⊚ | | ○ | ⊚ | ○⊚ | | ○ | ⊚ |
| Adhesion between P and L[3)] | ⊚ | ⊚ | ⊚ | ⊚ | ⊚ | ⊚ | ⊚ | ⊚ | ⊚ | ⊚ |
| Resistance to Scratch | ○ | ○ | ○ | ○ | ○ | ○ | ○ | ○ | ○ | ○ |

| | Comp. Ex. No. | | | | | |
|---|---|---|---|---|---|---|
| | 1 | 2 | 3 | 4 | 5 | 6 |
| Formulation of P | 2 | 5 | 6 | 9 | 10 | 11 |
| Treatment of S with Silane Coupling Agent | No | No | No | No | No | No |
| Adhesion between P and S | X | X | X | X | X | ⊚ |
| Adhesion between P and L | * | * | * | * | * | ○ |
| Resistance to Scratch | * | * | * | * | * | △ |

⊚: very good;
○: good;
△: rather bad
X: bad
*: evaluation impracticable
[1)]P: Primer,
[2)]S: Support,
[3)]L: Light-sensitive layer

What is claimed is:

1. A presensitized plate for use in making a lithographic printing plate requiring no dampening water comprising a substrate having provided thereon, in order, a primer layer, a light-sensitive layer and a silicone rubber layer wherein the primer layer consists essentially of at least one compound selected from those having urethane or/and urea bonds comprising as a basic skeleton, a reaction product of a polyisocyanate compound with a polyol compound and/or a polyamine compound, adhered to the substrate with a functional group-containing silane coupling agent represented by the following general formula:

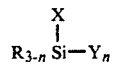

wherein n is an integer ranging from 1 to 3; X represents an alkyl group, a vinyl group or an organic group having a functional group showing affinity to or capable of being bonded to the compound included in the primer layer; R represents a hydrogen atom or an alkyl group having 1 to 5 carbon atoms; and Y represents an organic group which generates a hydroxyl group through hydrolysis or a hydroxyl group.

2. The presensitized plate of claim 1 wherein the compound having urethane and/or urea bonds is a compound comprising, as a basic skeleton, a reaction product of a polyisocyanate compound represented by the following general formula (I) with a polyol compound represented by the following general formula (II) and/or a polyamine compound represented by the following general formula (III):

OCN-L¹-NCO                                    (I)

wherein L¹ represents a divalent aliphatic or aromatic hydrocarbon connecting group which may have substituents selected from alkyl, aralkyl, aryl and alkoxy groups and halogen atoms;

HO-L²-OH                                    (II)

wherein L² represents a divalent aliphatic or aromatic hydrocarbon connecting group which may have substituents selected from alkyl, aralkyl, aryl and alkoxy groups and halogen atoms and which may contain an intervening ester or ether bond;

H₂N-L³-NH₂                                (III)

wherein L³ represents a divalent aliphatic or aromatic hydrocarbon connecting group which may have substituents selected from alkyl, aralkyl, aryl and alkoxy groups and halogen atoms.

3. The presensitized plate of claim 2 wherein the compound represented by the general formula (I) is selected from the group consisting of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate, 3,3'-dimethylbiphenyl-4,4'-diisocyanate, hexamethylenediisocyanate, isophoronediisocyanate and 4,4'-methylenebis(cyclohexyldiisocyanate); the compound represented by the general formula (II) is selected from the group consisting of ethylene glycol, diethylene glycol, triethylene glycol, propylene glycol, polyethylene glycol, polypropylene glycol, neopentyl glycol, 1,4-butanediol, 1,3-butanediol, 1,6-hexanediol, hydrogenated bisphenol A, ethylene oxide adduct of hydrogenated bisphenol A and polyesterdiol; and the compound represented by the general formula (III) is selected from the group consisting of ethylenediamine, 1,4-tetramethylenediamine, 1,6-hexamethylenediamine, isophoronediamine, mxylylenediamine, p-xylylenediamine, 4,4'-diaminodiphenylmethane, 4,4'-diaminodiphenyl ether and 4,4'-methylenebis(2-chloroaniline).

4. The presensitized plate of claim 1 wherein the molar ratio of the diol compound to the diamine compound ranges from 0.1:0.9 to 0.9:0.1.

5. The presensitized plate of claim 4 wherein the molar ratio of the diol compound to the diamine compound ranges from 0.2:0.8 to 0.8:0.2.

6. The presensitized plate of claim 1 wherein the compound having urethane or/and urea bonds has a weight-average molecular weight of not less than 5,000.

7. The presensitized plate of claim 6 wherein the compound having urethane or/and urea bonds has a weight-average molecular weight ranging from 10,000 to 200,000.

8. The presensitized plate of claim 1 wherein the silane coupling agent is at least one member selected from the group consisting of those represented by the following general formula:

$$R_{3-n}Si\genfrac{}{}{0pt}{}{X}{|}-Y_n$$

wherein R represents a hydrogen atom or an alkyl group having 1 to 5 carbon atoms; X represents an alkyl group, a vinyl group or an organic group having a functional group showing affinity to or capable of being bonded to the compound included in the primer layer; Y represents an organic group which generates a hydroxyl group through hydrolysis or a hydroxyl group; and n is an integer ranging from 1 to 3.

9. The presensitized plate of claim 8 wherein, in the general formula, the substituent X is a methyl group, a vinyl group or an aliphatic hydrocarbon group, which may include an aromatic hydrocarbon group therein, having a functional group selected from the group consisting of a vinyl, methacryloyl, amino, quaternary ammonium, epoxy, isocyanate and mercapto groups and chlorine atom; Y is an alkoxy group having 1 to 5 carbon atoms, an alkoxyalkoxy group having 3 to 5 carbon atoms, an acyloxy group having 2 to 5 carbon atoms, a dialkylamino group, trimethylsilylamino group or chlorine atom.

10. The presensitized plate of claim 9 wherein, in the general formula, the substituent X is an organic group having a functional group showing affinity to or capable of being bonded to the compound included in the primer layer selected from the group consisting of N-( β-aminoethyl)- γ-aminopropyl group, γ-methacryloxypropyl group, N-[( β-vinylbenzylamino)ethyl]- γ-aminopropyl group, γ-glycidoxypropyl group, γ-mercaptopropyl group, γ-chloropropyl group, γ-anilinopropyl group, γ-isocyanatopropyl group or C₁₈H₃₇-N⁺(CH₃)₂-(CH₂)₃-; and Y is a methoxy group, γ-methoxyethoxy group, acetyloxy group, dimethylamino group, a chlorine atom or trimethylsilylamino group.

11. The presensitized plate of claim 1 wherein the silane coupling agent is at least one member selected from the group consisting of vinyltrimethoxysilane, vinyltriethoxysilane, vinyltris( β-methoxyethoxy)silane, vinyltrichlorosilane, γ-(methacryloxypropyl) trimethoxysilane, vinyltriacetoxysilane, N-( β-aminoethyl)- γ-aminopropyltrimethoxysilane, N-( β-aminoethyl)- γ-aminopropylmethyl dimethoxysilane, γ-aminopropyltriethoxysilane, N-(β-aminoethyl)- γ-aminopropyltriethoxysilane, N-phenyl-γ-aminopropyltrimethoxysilane, γ-glycidoxypropyltrimethoxysilane, γ-glycidoxypropylmethyldimethoxysilane, β-(3,4-epoxycyclohexyl)ethyltrimethoxysilane, γ-mercaptopropyltrimethoxysilane, γ-mercaptopropylmethyldimethoxysilane, γ-chloropropyltrimethoxysilane, γ-chloropropylmethyldimethoxysilane, methyltrichlorosilane, dimethyldichlorosilane, trimethylchlorosilane,; -isocyanatopropyltrimethoxysilane, γ-isocyanatopropylmethyldimethoxysilane, γ-isocyanatopropyltriethoxysilane and γ-isocyanatopropylmethyldiethoxysilane.

12. The presensitized plate of claim 1 wherein the silane coupling agent is coated on the surface of the substrate or added to a coating solution for forming the primer layer.

13. The presensitized plate of claim 12 wherein the solution comprises a polyfunctional isocyanate group-containing monomer.

14. The presensitized plate of claim 1 wherein the thickness of the primer layer ranges from 0.5 to 20 g/m² expressed in the amount determined after drying.

15. The presensitized plate of claim 1 wherein the light-sensitive layer is a photopolymerizable light-sensitive layer.

16. The presensitized plate of claim 15 wherein the photopolymerizable light-sensitive layer comprises:

(i) a monomer or an oligomer having at least one photopolymerizable, olefinically unsaturated double bond;

(ii) an organic solvent-soluble polyurethane or polyamide resin which is solid at room temperature and has film-forming ability; and (iii) a photopolymerization initiator.

17. The presensitized plate of claim 16 wherein the amount of the photopolymerizable light-sensitive layer ranges from about 0.1 to 10 g/m² expressed in the amount determined after drying.

18. The presensitized plate of claim 1 wherein the silicone rubber layer is a layer of a partially or completely crosslinked polydiorganosiloxane having the following repeating units:

wherein R represents a monovalent group selected from an alkyl, aryl or alkenyl group or a combination thereof, which may be substituted with halogen atoms, amino, hydroxyl, alkoxy, aryloxy, (meth)acryloxy and/or thiol groups.

19. The presensitized plate of claim 18 wherein the silicone rubber layer is an addition type silicone rubber layer and the layer comprises:

(1) 100 parts by weight of an organopolysiloxane having at least two alkenyl groups which are directly bonded to the silicon atom;

(2) 0.1 to 1,000 parts by weight of an organo hydrogen polysiloxane having at least two $\equiv$SiH bonds in the molecule; and (3) 0.00001 to 10 parts by weight of a catalyst for addition polymerization.

* * * * *